(12) United States Patent
Polomoff et al.

(10) Patent No.: US 10,770,412 B2
(45) Date of Patent: Sep. 8, 2020

(54) GUARD RING FOR PHOTONIC INTEGRATED CIRCUIT DIE

(71) Applicant: GLOBALFOUNDRIES INC., Grand Cayman (KY)

(72) Inventors: Nicholas A. Polomoff, Irvine, CA (US); Andreas D. Stricker, Essex Junction, VT (US); Anupam I Arora, Essex Junction, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/109,867

(22) Filed: Aug. 23, 2018

(65) Prior Publication Data

US 2020/0066656 A1 Feb. 27, 2020

(51) Int. Cl.
| H01L 23/58 | (2006.01) |
| H01L 23/522 | (2006.01) |
| H01L 23/528 | (2006.01) |
| H01L 23/00 | (2006.01) |
| G02B 6/12 | (2006.01) |

(52) U.S. Cl.
CPC ........ *H01L 23/585* (2013.01); *G02B 6/12004* (2013.01); *H01L 23/528* (2013.01); *H01L 23/5226* (2013.01); *H01L 23/562* (2013.01); *H01L 24/05* (2013.01); *H01L 24/13* (2013.01); *G02B 2006/12104* (2013.01); *H01L 2224/0401* (2013.01); *H01L 2224/05573* (2013.01); *H01L 2224/13023* (2013.01); *H01L 2224/13025* (2013.01)

(58) Field of Classification Search
CPC ... H01L 23/585; H01L 23/528; H01L 23/562; H01L 23/5226; H01L 24/05; H01L 24/13; G02B 6/12004
See application file for complete search history.

(56) References Cited

U.S. PATENT DOCUMENTS

| 6,455,910 | B1 | 9/2002 | Wang |
| 7,256,474 | B2 | 8/2007 | Wakayama et al. |
| 8,188,574 | B2 | 5/2012 | Angyal et al. |
| 9,806,112 | B1 | 10/2017 | Celo et al. |
| 2003/0091264 | A1* | 5/2003 | Kimerling ............... G02B 6/42 385/14 |
| 2004/0061183 | A1 | 4/2004 | Johnson et al. |
| 2008/0048294 | A1 | 2/2008 | Yamamoto |
| 2008/0099884 | A1 | 5/2008 | Inohara |

(Continued)

FOREIGN PATENT DOCUMENTS

| TW | I284974 B | 8/2007 |
| WO | 2014132242 A1 | 9/2014 |

*Primary Examiner* — Ahmed N Sefer
(74) *Attorney, Agent, or Firm* — Anthony Canale; Hoffman Warnick LLC

(57) ABSTRACT

Embodiments of the disclosure provide a photonic integrated circuit (PIC) die including: a semiconductor substrate; active circuitry on the semiconductor substrate; an inter-level dielectric (ILD) over the semiconductor substrate and the active circuitry; a photonic element extending from the active circuitry on the semiconductor substrate; and a guard ring on the semiconductor substrate and within the ILD, the guard ring surrounding the active circuitry, the guard ring including: a conductive body, and a conductive bridge element extending over the photonic element.

16 Claims, 10 Drawing Sheets

(56) References Cited

U.S. PATENT DOCUMENTS

| | | |
|---|---|---|
| 2013/0256826 A1 | 10/2013 | Gambino et al. |
| 2014/0086523 A1* | 3/2014 | Block ............... G02F 1/065 385/3 |
| 2014/0321802 A1* | 10/2014 | Ellis-Monaghan ...................... G02B 6/4214 385/14 |
| 2015/0097257 A1* | 4/2015 | Gambino ............... G02B 6/122 257/432 |
| 2017/0054039 A1* | 2/2017 | Gong ............... H01L 21/76802 |
| 2019/0004342 A1* | 1/2019 | Iida ............... G02F 1/0147 |
| 2019/0006535 A1* | 1/2019 | Kuwajima ........ H01L 31/02327 |

\* cited by examiner

GUARD RING FOR PHOTONIC INTEGRATED CIRCUIT DIE

BACKGROUND

Technical Field

The present disclosure relates to protecting photonic integrated circuit (PIC) dies, including photonic elements, e.g., optical fibers and waveguides. In particular, embodiments of the present disclosure relate to a PIC die with a guard ring structured for use with one or more photonic elements.

Related Art

Photonic packages with photonic integrated circuit (PIC) dies require complex packaging integration schemes. In particular, photonic elements such as optical fibers or optical fiber arrays are optically coupled to the PIC die and internal waveguides thereof. Conventionally, optic receptacles in a surface of the PIC die provide an alignment and retention feature for passive alignment of an optical fiber to couple light from an end surface (typically, 125 micrometers (um) fiber outer diameter with a 9 um fiber core) thereof to an exposed end of an optical waveguide (approximately 200× 450 nanometers (nm)) in the PIC die. In this process, optical fibers are positioned by a pick-and-place tool into respective fiber optic receptacles in a surface of the PIC die. Fiber optic receptacles enable two linear contact regions for each optical fiber to align the optical fiber core to a silicon waveguide in the PIC die. The two linear contact regions ensure passive optical alignment when the optical fiber(s) is fully seated within the receptacle, with an optical fiber end to waveguide end separation of perhaps +/−five um. Once in position, the optical fibers are secured in place using a refractive index (RI) matching optical adhesive, which is ultraviolet (UV) cured to tack the adhesive, often prior to full curing using a thermal cure process.

One challenge associated with PIC technology is the need to house optical and electrical components in a single die to be, packaged, and deployed. Conventional integrated circuit dies may include one or more guard structures for physically protecting and electrically isolating portions of a device structure from other components connected to, or mounted on, a particular wafer. Such guard structures may be unsuitable for use with PIC devices because the photonic elements, e.g., optical waveguides, may extend horizontally into and out of the device structure to enable communication with other components outside the PIC die. Thus, it is impossible for a conventional guard structure to be formed in the PIC die without blocking the pathway of one or more photonic elements, or otherwise increasing the risk of optical interference from the reflective surface of a metal in the guard structure.

SUMMARY

A first aspect of the disclosure provides a photonic integrated circuit (PIC) die, including: a semiconductor substrate; active circuitry on the semiconductor substrate; an inter-level dielectric (ILD) over the semiconductor substrate and the active circuitry; a photonic element extending from the active circuitry on the semiconductor substrate; and a guard ring on the semiconductor substrate and within the ILD, the guard ring surrounding the active circuitry, the guard ring including: a conductive body, and a conductive bridge element extending over the photonic element.

A second aspect of the disclosure provides a photonic integrated circuit (PIC) die, including: a semiconductor substrate; active circuitry on the semiconductor substrate; an inter-level dielectric (ILD) over the semiconductor substrate and the active circuitry; a photonic element extending from the active circuitry on the semiconductor substrate; and a guard ring on the semiconductor substrate and within the ILD, the guard ring surrounding the active circuitry, the guard ring including: a conductive body on the semiconductor substrate having a first terminal segment and a second terminal segment, a first via coupled to the first terminal segment of the conductive body; a second via coupled to the second terminal segment of the conductive body, and a bridge wire coupling the first and second vias, the bridge wire extending above and across the photonic element.

A third aspect of the disclosure provides a photonic integrated die (PIC) structure, including: a semiconductor substrate; active circuitry on the semiconductor substrate; an inter-level dielectric (ILD) over the semiconductor substrate and the active circuitry; a plurality of photonic elements on the semiconductor substrate extending from the active circuitry to an exterior sidewall of the PIC die; and a guard ring on the semiconductor substrate and within the ILD, the guard ring surrounding the active circuitry, the guard ring including: a conductive body on the semiconductor substrate, and a plurality of conductive bridge elements, each conductive bridge element including: a first via coupled to a first terminal segment of the conductive body; a second via coupled to a second terminal segment of the conductive body, and a bridge wire coupling the first and second vias, the bridge wire extending over the photonic element.

BRIEF DESCRIPTION OF THE DRAWINGS

The embodiments of this disclosure will be described in detail, with reference to the following figures, wherein like designations denote like elements, and wherein.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific illustrative embodiments in which the present teachings may be practiced. These embodiments are described in sufficient detail to enable those skilled in the art to practice the present teachings and it is to be understood that other embodiments may be used and that changes may be made without departing from the scope of the present teachings. The following description is, therefore, merely illustrative.

The present disclosure relates to photonic integrated circuit (PIC) dies which include a guard ring for protecting active circuitry of the PIC die. PIC dies may include a wafer of semiconductor material with receptacles to hold photonic elements (e.g., optical waveguides structured for coupling to optical fibers) in communication with active circuitry of the PIC die. Non-photonic IC structures conventionally include a guard ring, e.g., a wall of metal, continuously surrounding the active components on a wafer. PIC dies, which include photonic elements extending horizontally across a semiconductor substrate, cannot be protected with conventional guard rings because such guard rings block the pathway of the photonic elements. Consequently, conventional guard structures for protecting active circuitry on a PIC die are non-continuous. That is, PIC die guard structures conventionally include gaps where photonic elements may pass without contacting metal components of the structure. Such non-continuous guard elements are substantially weaker than guard rings in conventional IC structures. Embodiments of the disclosure provide a continuous guard ring with one or more conductive bridge structures. Photonic elements may traverse the guard ring by extending horizontally beneath the conductive bridge structure of the guard ring.

Figure 1:
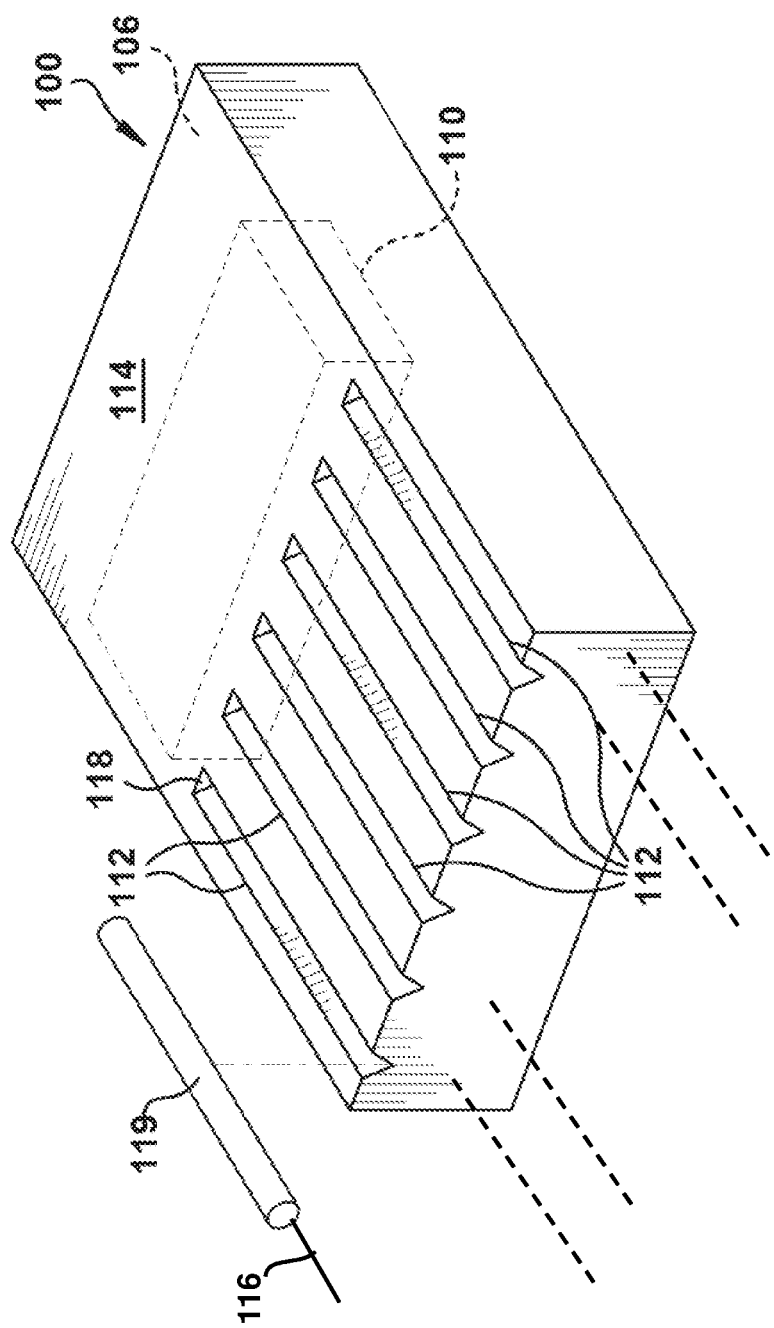
FIG. 1 shows a perspective view of a PIC die according to embodiments of the disclosure.
Figure 2:
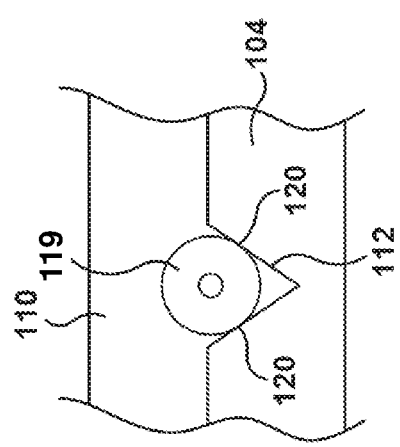
FIG. 2 shows an enlarged cross-sectional view of a photonic element in the PIC die of FIG. 1.

FIGS. 1 and 2 each show a portion of a PIC die 100 according to embodiments of the disclosure. FIG. 1 in particular shows a partial perspective view of PIC die 100, and it is understood that PIC die 100 includes additional elements not specifically shown in the partial view of FIG. 1. Other portions of PIC die 100 are indicated by phantom lines extending outward in FIG. 1. PIC die 100 may include any now known or later developed semiconductor material suitable for a PIC device. As understood in the art, PIC die 100, also known as an integrated optical circuit, may be any device that includes active circuitry 106 for integrating multiple photonic functions for optical information signals received thereby via, e.g., one or more photonic elements. Such functions oftentimes include converting the optical information signals to electrical signals or vice versa. Active circuitry 106 thus may include optical circuitry, electrical circuitry, and combinations of optical and electrical circuitry. In some cases, active circuitry 106 may be alternatively known as optical-electrical circuitry. As examples, active circuitry 106 of PIC die 100 may include one or more passive photonic devices such as waveguides, couplers, splitters, polarization splitters, rotators, filters, etc. According to further examples, active circuitry 106 of PIC die 100 may include one or more active photonic devices such as modulators, detectors, phase shifters, etc. Active circuitry 106 may include an optical waveguide system 110 (e.g., grating coupler or I/O waveguide), but may also include, depending on application, other components such as but not limited to: a Bragg reflector, an arrayed waveguide grating or other waveguide structure, transistor based electronics including detectors and modulators, amplifiers, and/or an externally modulated laser diode with an electro-absorption modulator. It is understood that optical waveguide system 110 may include structures to guide light/signals from each optical fiber coupled thereto, individually. PIC die 100 also includes a plurality of V-groove fiber optic receptacles 112 in a surface 114 thereof.

As understood in the art, each V-groove fiber optic receptacle 112 may hold a portion of a photonic element 116 therein for alignment of photonic element 116 with an input 118 of, e.g., optical waveguide system 110. Photonic element 116 more specifically may be embodied as an optical waveguide formed, e.g., of silicon, and extending horizontally through PIC die 100. In this case, portions of photonic element 116 may be coupled to an optical fiber 119 positioned within V-groove fiber optic receptacle 112. A plurality of optical fibers 119, e.g., coupled in some way as an array, may be coupled to PIC die 100, or may be provided as individual optical fibers 119. In some cases, a plurality of optical fibers 119 may be individually placed in respective V-groove fiber optic receptacle 112. FIG. 2 shows an enlarged cross-sectional view of a photonic element 116 in the form of a single optical fiber 119 in a respective V-groove fiber optic receptacle 112. As illustrated, V-groove fiber optic receptacles 112 are sized to mate with a particularly sized optical fiber 119. A circularly cross-sectioned optical fiber 119 may meet a respective V-groove fiber optic receptacle 112 along two linear regions 120 (FIG. 2 only, extending into and out of page), thus providing precision alignment for coupling with input(s) 118 to the optical waveguide system 110. While six V-groove fiber optic receptacles 112 are shown in FIG. 1, it is understood that any number of receptacles may be employed to receive any number of matching photonic elements.

In some cases, optical fiber 119 may be adhered to V-groove fiber optical receptacle 112 using one or more adhesive materials. In one embodiment, any appropriate ultraviolet (UV) curable adhesive may couple optical fiber 119 to V-groove fiber optic receptacle 112. UV radiation may be applied to optical fiber 119 for bonding to V-groove fiber optic receptacle 112 using any appropriate UV radiation source, e.g., typically 365-385 nanometer (nm) wavelength light. Thermal bonding of optical fiber 119 to V-groove fiber optic receptacle 112 may also be provided through an annealing chamber, hot plate, etc.

Figure 3:
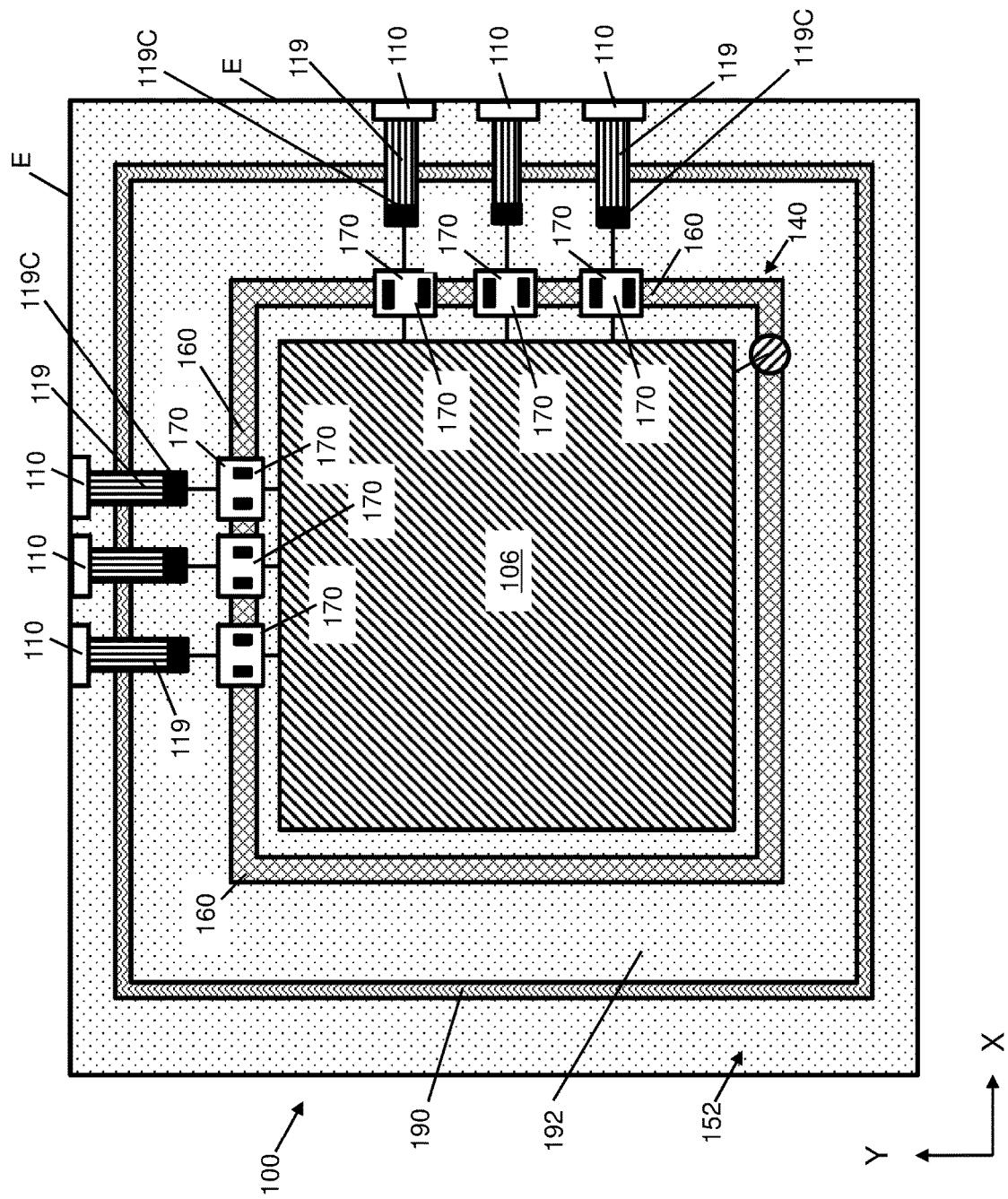
FIG. 3 shows a plan view of a PIC die with a guard ring according to embodiments of the disclosure.
Figure 4:
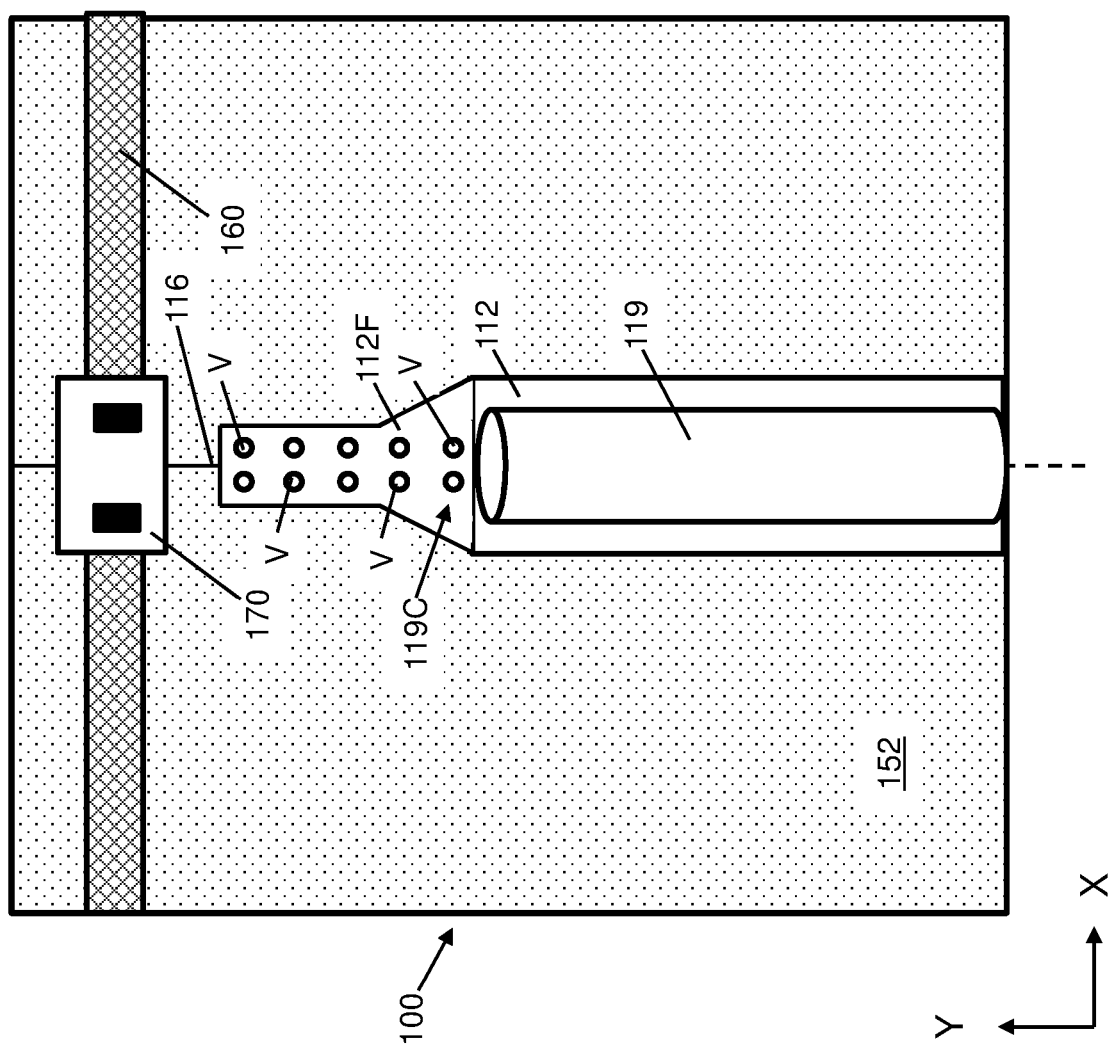
FIG. 4 shows an expanded plan view of an optical fiber, photonic element, and guard ring in a PIC die according to embodiments of the disclosure.
Figure 5:
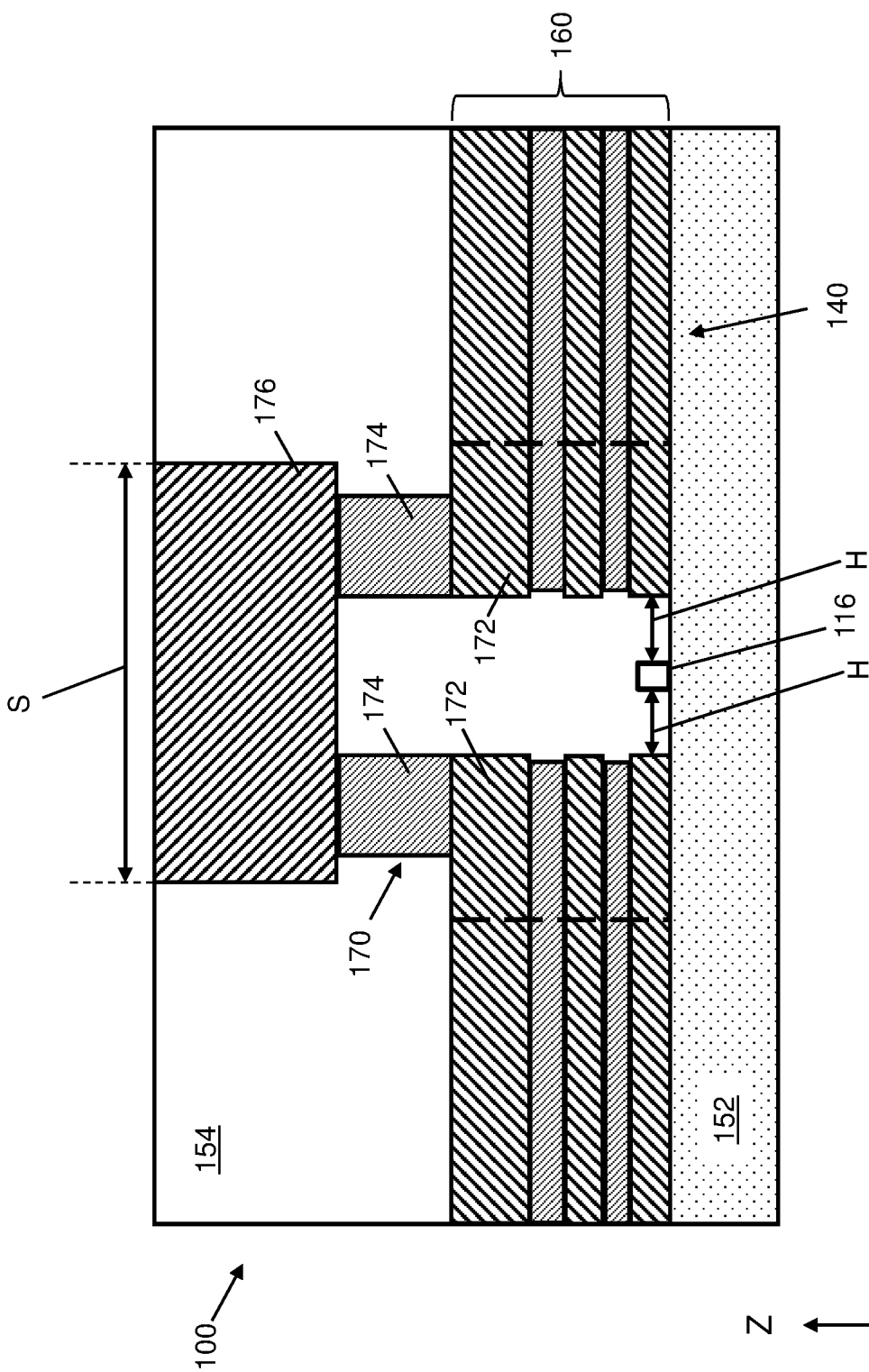
FIG. 5 shows a cross-sectional view of a conductive bridge element of the guard ring according to embodiments of the disclosure.

Turning to FIGS. 3-5 together, PIC die 100 according to the disclosure may include a guard ring 140 that is structurally continuous (i.e., surrounds active circuitry 106 without structural discontinuities such as gaps). Guard ring 140 continuously surrounds active circuitry 106, but also permits photonic elements 116, e.g., photonic waveguides as discussed herein, to extend from an exterior sidewall E of PIC die 100 into active circuitry 106. Active circuitry 106 may generally refer to various active elements within PIC die 100, as well as portions of PIC die 100 for housing various electrical and/or photonic elements therein. FIGS. 4 and 5 show only a portion of guard ring 140 to further emphasize various subcomponents. PIC die 100 may be formed to include, e.g., a semiconductor substrate 152. Semiconductor substrate 152 may be at least partially composed of any currently known or later developed semiconductor material, which may include without limitation: silicon, germanium, silicon germanium, silicon carbide, and substances consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substances may include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Active circuitry 106, portions of guard ring 140, and other components discussed herein may be formed directly on semiconductor substrate 152, or in other cases may be vertically above semiconductor substrate 152 (e.g., within an insulator layer such as an inter-level dielectric (ILD) 154 (FIG. 4)) where noted herein.

Turning briefly to FIG. 4, guard ring 140 may be configured to accommodate portions of photonic element 116. As shown, V-groove fiber optic receptacle 112 may include an optical coupler 119C within a receptacle terminus 112F positioned horizontally between the end of optical fiber 119 and guard ring 140. Optical coupler 119C may take the form of a housing element for optical fiber 119, and may include a set of ventilation holes V for thermally conducting heat from optical fiber 119 through PIC die 100. Optical coupler 119C, which may be embodied as a spot size converter or other optical conversion element, collects broad light beams from photonic fiber 119 to be funneled into photonic element 116. In such cases, photonic element 116 may include a silicon or silicon dioxide-based waveguide. In any case, photonic element 116 extends horizontally across PIC die 100 from photonic fiber 119 toward guard ring 140. To allow photonic element 116 to pass through guard ring 140, guard ring 140 may include vertical elements for passing over the location of photonic element 116 on PIC die 100. As discussed elsewhere herein, guard ring 140 may include a conductive body 160 on semiconductor substrate 152, and a conductive bridge element 170 mechanically and electrically connected to conductive body 160 to allow photonic element 116 to pass through guard ring 140.

Referring specifically to FIG. 5, PIC die 100 may include one or more layers of inter-level dielectric (ILD) 154 formed on semiconductor substrate 152. ILD 154 is included on PIC die 100 to vertically separate semiconductor substrate 152 from metal layers included therewithin, e.g., back end of line (BEOL) portions of a device. ILD 154 may include one or more layers of one or more currently known or later developed materials for providing electrical insulation, e.g., silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, SiLK (a polyarylene ether available from Dow Chemical Corporation), a spin-on silicon-carbon containing polymer material available from JSR Corporation, other low dielectric constant (<3.9) material, or layers thereof. ILD 154 will typically include several distinct layers for separating individual metal levels of a structure, but ILD 154 is shown by example as a single element in the accompanying FIGS. solely for illustration purposes. As shown in FIG. 4, photonic element 116 (including, e.g., optical fiber 119) may be positioned on semiconductor substrate 152 and within and/or beneath at least one layer of ILD 154. Portions of guard ring 140 may be positioned on semiconductor 152, while also passing vertically through layers of ILD 154 and above photonic element 116.

Guard ring 140 includes several subcomponents for preventing physical contact or optical interference with photonic element 116, while also being structurally continuous on semiconductor substrate 152 about active circuitry 106. Guard ring 140 may include, e.g., at least one conductive body 160 composed of one or more light-reflecting metals, and located on semiconductor substrate 152. Conductive body 160 in particular may include one or more light-reflecting metals included in metal wires of an IC structure, e.g., copper (Cu), aluminum (Al), tungsten (W), cobalt (Co), etc. Conductive body 160 may be a single element extending continuously about active circuitry 106, or may include multiple distinct conductive bodies 160 physically joined together by other structures discussed herein.

According to the example in FIG. 5, conductive body 160 may include several regions of metal layered directly on top of each other above substrate 152. According to one example, conductive body 160 may include a set of substantially rectangular wire portions and via portions each having a distinct cross-sectional area. For instance, wire portions of conductive body 160 may have a larger cross-sectional area, while each via portion may have a smaller cross-sectional area and may be located directly above or below a wire portion of conductive body 160. In this case, the via portions may resemble a set of legs, support, etc., extending vertically beneath larger portions of conductive body 160. An example of such an arrangement is shown, e.g., in FIG. 7, in which conductive body 160 includes a larger rectangular portion positioned directly on a pair of narrower rectangular portions. In other arrangements, e.g., FIG. 8, conductive body 160 may include only one metal layer, with other portions of guard ring 140 outside conductive body 160 being formed in intermediate layers. Although conductive body 160 may include several portions with different sizes and surface areas, these portions may constitute a single conductive body 160 as a result of being structurally continuous and/or directly in contact with each other. In the case of multiple conductive bodies 160, each individual conductive body 160 may form part of the same guard ring 140 surrounding active circuitry 106.

Conductive body 160 may have a variety of geometrical profiles. In a simplified example, conductive body 160 may be substantially rectangular on semiconductor substrate 152. According to further examples, conductive body 160 may include a series of rectangular conductive elements positioned on semiconductor substrate 152, and a larger rectangular structure continuous with, or formed directly on, the series of conductive elements positioned on semiconductor substrate 152. It is thus understood that conductive body 160 may include conductive materials in any conceivable shape, or combination of shapes, positioned on semiconductor substrate 152.

To reduce or prevent optical interference with photonic element 116 (e.g., via light reflection), conductive body 160 may be horizontally separated from photonic element 116. The horizontal separation distance between photonic element 116 and conductive body 160 may be chosen to prevent photonic signal loss within photonic element 116. Additionally, the horizontal separation distance between conductive body 160 and photonic element 116 may be small enough to prevent ingress or egress of water atoms or other substances through guard ring 140 (i.e., via portions of ILD 154 between photonic element 116 and conductive body 160). Controlling the horizontal separation distance between conductive body 160 and photonic element 116, e.g., during manufacture, may ensure that guard ring 140 prevents water or other embedded contaminants from traveling outside guard ring 140 toward active circuitry 106. The appropriate separation distance between photonic element 116 and conductive body 160 may vary from application to application. According to one example, a horizontal separation distance H between photonic element 116 and conductive body 160 may be, e.g., at least approximately two micrometers (μm). To prevent water ingress or egress through guard ring 140, horizontal separation distance H may be at most approximately five μm in one example. Separation distance H may be substantially smaller than the radius or diameter of optical fiber(s) 119 (FIGS. 3, 4, only), such that only photonic element 116 (e.g., optical waveguides) pass through guard ring 140. In any case, photonic elements 116 pass horizontally through guard ring 140 without touching conductive body 160, or other portions of guard ring 140 discussed herein. Thus, guard ring 140 as discussed herein may not cause optical interference with photonic element(s) 116 during operation, yet may be structured to prevent moisture or other contaminants from traveling through any space between photonic element 116 and conductive body 160.

Figure 6:
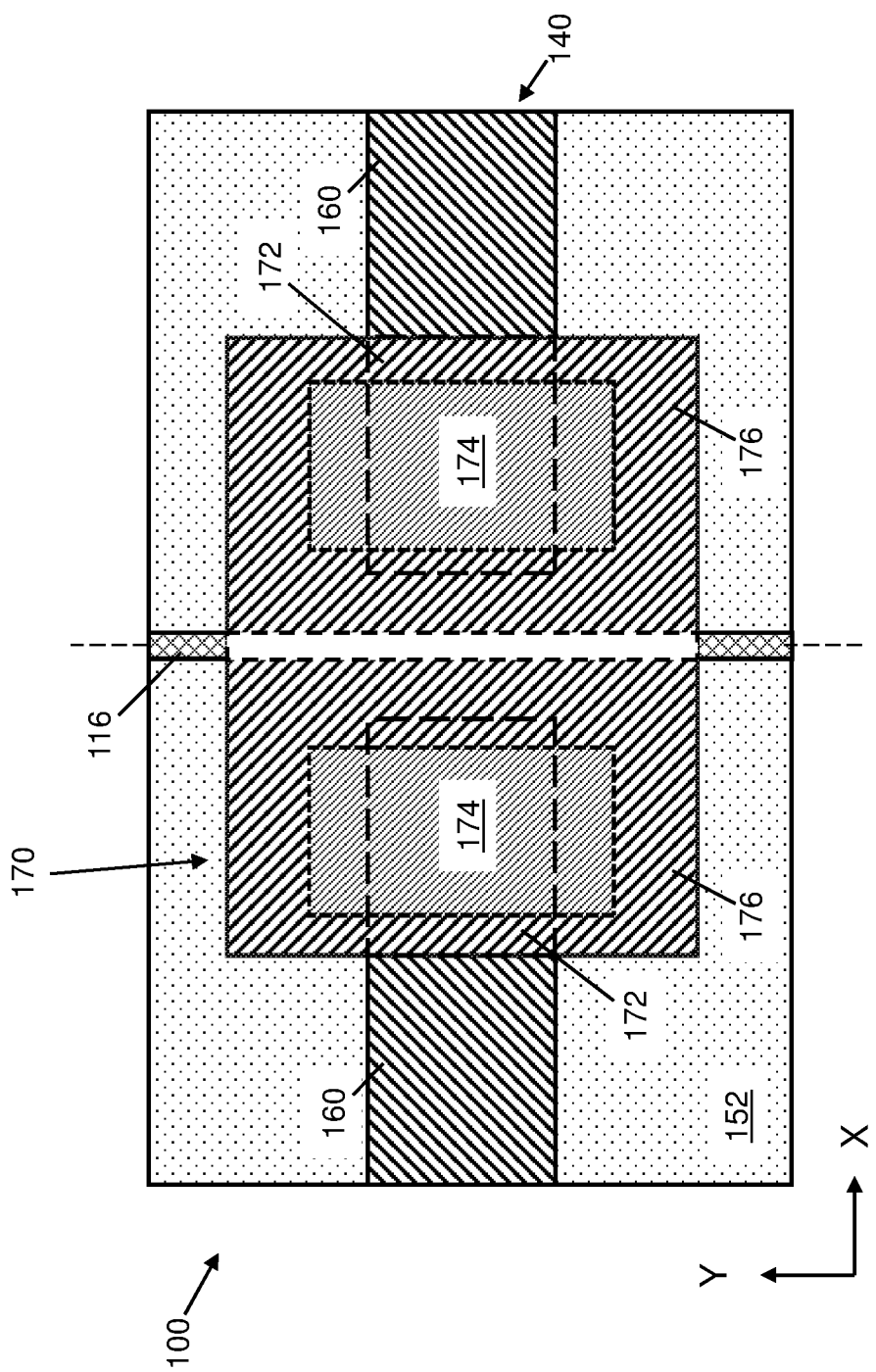
FIG. 6 shows a plan view of the conductive bridge element of the guard ring according to embodiments of the disclosure.

Referring to FIGS. 5 and 6 together, one or more conductive bridge elements 170 in guard ring 140 are shown according to embodiments of the disclosure. Together, conductive body 160 and conductive bridge element 170 allow an observer to trace a continuous conductive path along guard ring 140 about active circuitry 106 (FIG. 3), without entering ILD 154. To prevent physical contact and/or reduce or eliminate reflective interference with photonic element 116, guard ring 140 may include one or more conductive bridge elements 170. Each conductive bridge element 170 is formed to pass over photonic element 116, creating a space for photonic elements 116 to pass through guard ring 140 while maintaining structural continuity thereof. Each conductive bridge element 170 may physically connect two portions of conductive body 160, or two different conductive bodies 160. Conductive bridge element(s) 170 may pass horizontally over the top of one or more photonic elements 116. Conductive bridge element(s) 170 may be formed above photonic elements 116 at a height which reduces or prevents reflective interference between light within photonic elements 116, and the reflective metals of conductive bridge element(s) 170. Conductive bridge element(s) 170 thus will not impede the passage of light through photonic element(s) 116.

Conductive bridge element 170 includes multiple subcomponents for physically traversing the site of photonic element 116 on semiconductor substrate 152. For example, conductive bridge element 170 is structured to include a pair of terminal segments 172, each located at an end of conductive body 160. Terminal segments 172 may be positioned on opposite horizontal ends of one conductive body 160 (e.g., where guard ring 140 includes only one conductive body 160). Alternatively, two terminal segments 172 connected through conductive bridge element 170 may be horizontal ends of two different conductive bodies 160, on opposite horizontal sides of photonic element(s) 116. In either case, terminal segment(s) 172 may be structurally continuous with the remainder of conductive body 160. Terminal segments 172 may be defined as portions of conductive body 160 positioned substantially underneath a via 174 of conductive bridge element 170.

Vias 174 may provide a vertical coupling structure within conductive bridge element 170. Via 174 may include one or more conductive metals, including without limitation one or more example metals discussed with respect to conductive body 160, or other currently known or later developed conductive metals. In any case, each via 174 of conductive bridge element 170 may extend vertically through various layers of ILD 154 above conductive body 160 to a predetermined height above semiconductor substrate 152. Vias 174 may be formed within one or more layers of ILD 154 concurrently with one or more back end of line (BEOL) wiring layers of PIC die 100. Conductive bridge element 170 may also include a bridge wire 176 positioned directly on each via 174, and extending horizontally over photonic element 116 above semiconductor substrate 152. Bridge wire 176 may be formed within one or more layers of ILD 154 concurrently with one or more back end of line (BEOL) wiring layers of PIC die 100. Bridge wire 176 of conductive bridge element 170 vertically contacts and connects to each via 174 of conductive bridge element 170. Thus, bridge wire 176 may be located vertically above conductive body 160 while being structurally connected to conductive body 160 through vias 174. The horizontal length of bridge wire 176 along the X-axis may be sufficient to pass over photonic element 116, and thus may be at least equal to the total horizontal separation between terminal segments 172. According to one example, a horizontal length S of bridge wire 176 along X-axis may be at least approxi6, horizontal length S may be considerably less than the diameter of optical fiber 119 positioned elsewhere on PIC die 100. To prevent moisture ingress or egress through guard ring 140, horizontal space S may be no more than approximately fifteen μm in a further example. In the plan view of FIG. 5, terminal segments 172, vias 174, and portions of photonic element 116 are shown in phantom to denote their locations under bridge wire 176.

Guard ring 140 may provide electrical dissipation to ground without additional elements, despite the presence of conductive bridge element 170. As shown specifically in FIG. 5, conductive body 160 may be formed over semiconductor substrate 152. Conductive body 160 may be formed directly on semiconductor substrate 152, or may be vertically separated from semiconductor substrate 152 through a thin layer of insulator (not shown) configured to accommodate electrical dissipations to ground. The electrical interface between conductive body 160 and semiconductor substrate 152 may provide an electrical grounding pathway from guard ring 140 through semiconductor substrate 152. During operation, guard ring 140 may dissipate electrical energy within PIC die 100 to ground through semiconductor substrate 152 to other conductive wires and/or elements of PIC die 100. In this case, the composition of semiconductor substrate 152 may be chosen to exhibit sufficient conductivity for electrostatic charges to dissipate from guard ring 140 to ground through semiconductor substrate 152. As a result of being a continuous physical structure, conductive bridge element may also be electrically grounded through semiconductor substrate 152 as a result of being physically connected to conductive body 160. Semiconductor substrate 152 thus may act as an electrical ground for all conductive bodies 160 and conductive bridge elements 170 of guard ring 140.

Figure 7:
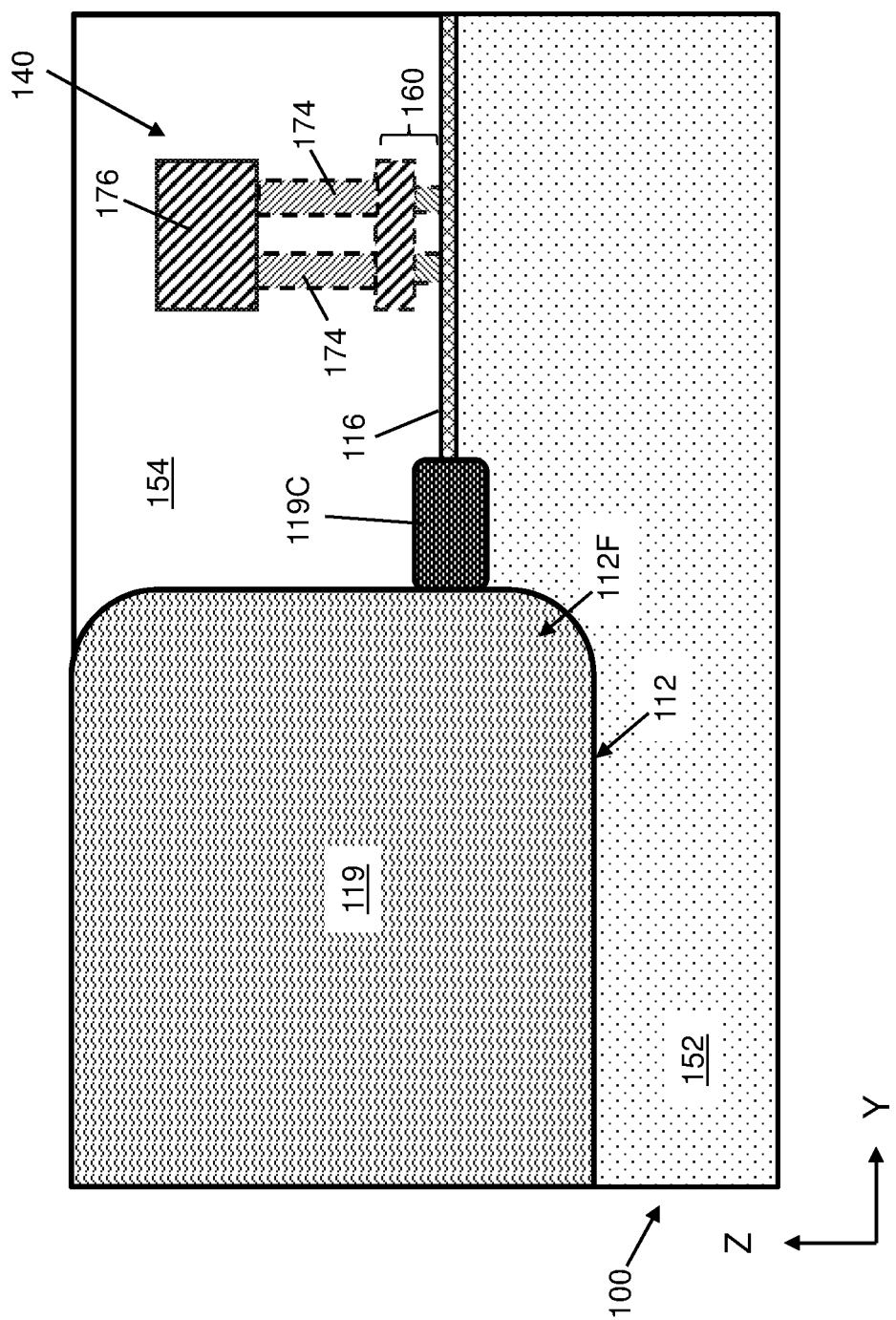
FIG. 7 shows a cross-sectional view in plane Y-Z of an optical fiber, photonic element, and guard ring in a PIC die according to embodiments of the disclosure.

Referring briefly to FIG. 7, a cross-section of guard ring 140 in plane Y-Z is shown to illustrate its position with respect to optical fiber 119. As discussed elsewhere herein, V-groove fiber optic receptacle 112 may include a receptacle terminus 112F for receiving a horizontal end of optical fiber 119. Receptacle terminus may be formed within semiconductor substrate 152 and horizontally displaced from a cross-section of guard bridge 140. As shown, photonic element 116 may extend horizontally outward from optical fiber 119 across semiconductor substrate 152. Photonic element 116 passes through guard ring 140 beneath bridge wire 176, and horizontally alongside conductive body 160. As indicated by phantom lines in FIG. 7, conductive body 160 and via(s) 174 may be positioned within a plane behind and/or in front of the plane of the page. Photonic element 116 thus may extend horizontally across PIC die 100 without being physically impeded by guard ring 140.

Figure 8:
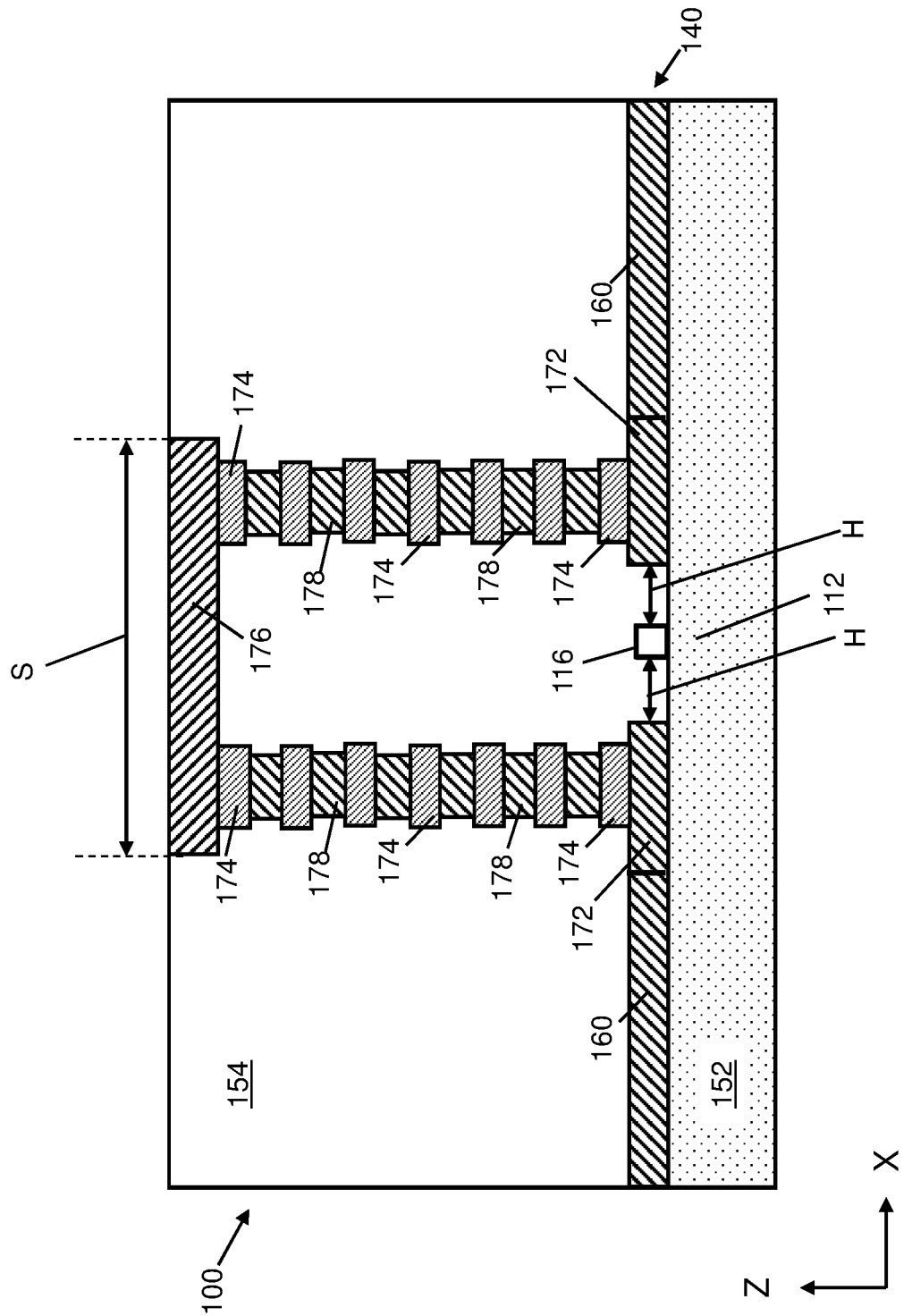
FIG. 8 shows a cross-sectional of a conductive bridge element of the guard ring extending through several metal layers according to embodiments of the disclosure.

Turning to FIG. 8, further embodiments of conductive bridge element 170 may extend vertically through several intervening components, e.g., multiple metal wires and vias. As shown, ILD 154 may contain several intermediate metal wires 178 each positioned vertically between semiconductor substrate 152 and bridge wire 176. Conductive bridge element 170 may include several vias 174 and intermediate metal wires 178, arranged alternatingly between terminal segment 172 and bridge wire 176. The total number of intermediate metal wires 178 may vary between embodiments. Although six intermediate metal wires 178 are shown vertically between terminal end segments 172 and bridge wire 176 in FIG. 6, more or fewer intermediate metal wires 178 may appear in other embodiments. Metal wires 178 may be arranged in successive layers of ILD 154, along with vias 174 extending vertically through portions of the respective layer(s) of ILD 154. Divisions between layers of ILD 154 are omitted in FIG. 6 solely for clarity of illustration. The configuration of metal wires 178 within PIC die 100 shown in FIG. 6 provides an example arrangement, and alternative numbers or arrangements of vias 174 and/or metal wires 178 are contemplated in embodiments of the disclosure. To this extent, vias 174 and metal wires 178 may be in direct vertical alignment, or may not be vertically aligned but in physical contact with each other.

Vias 174 for connecting metal wires 178 to each other, and other portions of conductive bridge element 170, may also include substantially annular refractory metal liners (not shown) disposed circumferentially about the metal(s) therein for electrically insulating vias 174, and for preventing electromigration defects in adjacent materials of PIC die 100. Such liners may be composed of, e.g., refractory metals such as ruthenium (Ru), tantalum (Ta), titanium (Ti), tungsten (W), iridium (Ir), rhodium (Rh) and platinum (Pt), etc., or mixtures of thereof. As shown in FIG. 6, each via 174 may extend substantially vertically through PIC die 100. Although vias 174 are shown to exhibit a substantially columnar shape, vias 174 may have different structures in further embodiments. More generally, vias 174 may have any desired shape or size, and may include, e.g., one or more electrically connected members which may each have linear profiles, curvilinear profiles, wave-type profiles, irregular profiles, etc.

Vias 174 may vertically couple each terminal end segment 172 to the vertically connected intermediate metal wire 178, and vertically through intermediate metal wires 178. Intermediate metal wires 178 within conductive bridge element 170 may allow guard ring 140 to be included in PIC dies 100 of varying size, or with varying numbers of metal levels. Intermediate metal wires 178 may be formed together with other intermediate metal wires 178 of active circuitry 106 (FIGS. 1, 3) within PIC die 100. Photonic element 116 and the remaining portions of guard ring 140, including conductive body 160 and/or bridge wire 176, may remain approximately in the same position as other embodiments regardless of how many intermediate metal wires 178 are included.

Figure 9:
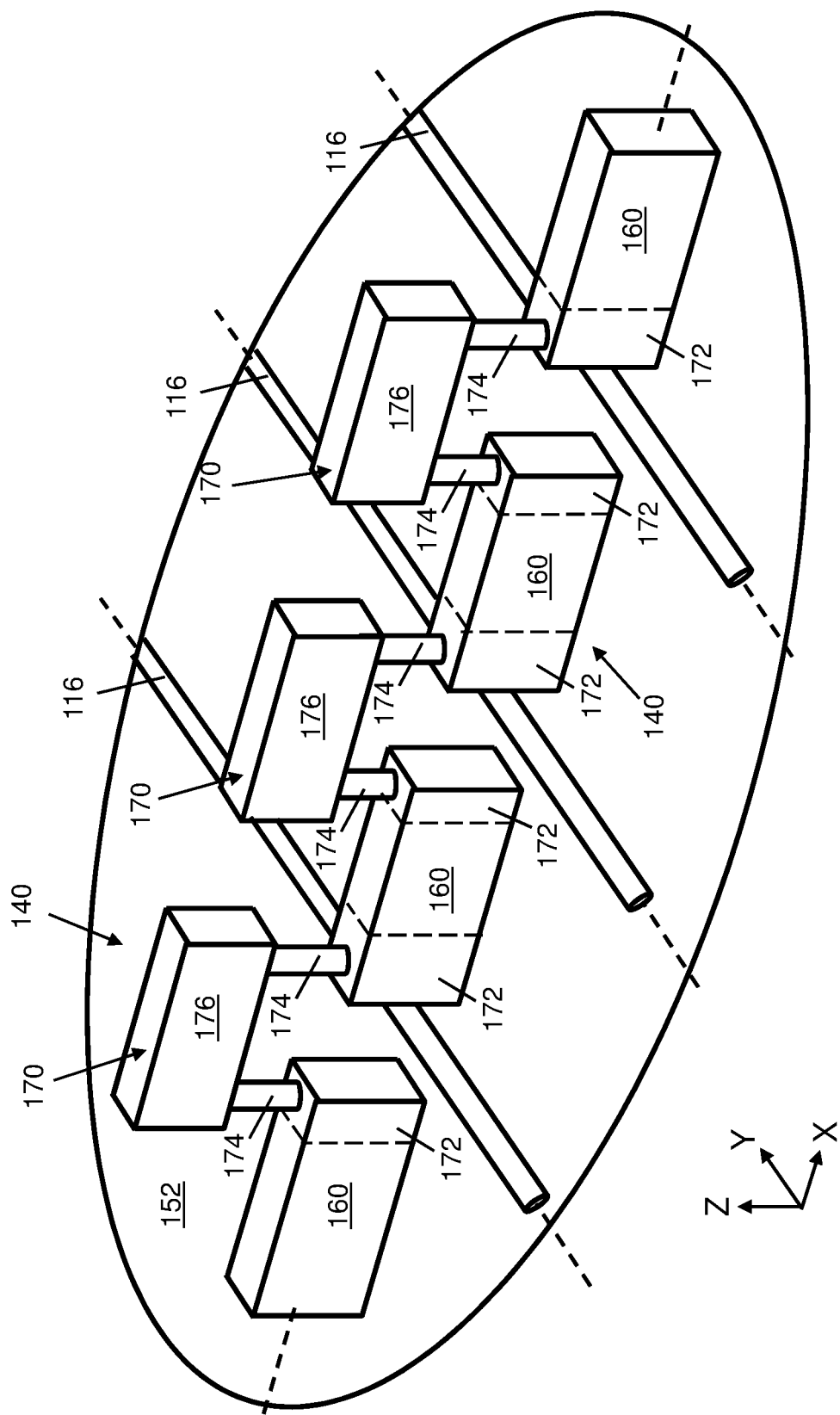
FIG. 9 shows a perspective view of a guard ring with several conductive bridge elements according to embodiments of the disclosure.

Referring to FIGS. 3 and 9 together, guard ring 140 may include several conductive bridge elements 170 on one PIC die 100, each coupled to conductive body/bodies 160 and passing over one or more photonic elements 116. In this case, guard ring 140 may include several conductive bodies 160 joined together through conductive bridge elements 170. ILD(s) 154 is omitted from FIG. 7 solely for clarity of illustration. Guard ring 140 may include several conductive bodies 160, pairs of which may be joined to each other through one conductive bridge element 170. Although guard ring 140 may include several conductive bodies 160 and several conductive bridge elements 170, guard ring 140 remains a unitary, continuous structure without gaps separating guard ring 140 into independent structures. Guard ring 140 may be designed to include one conductive bridge element 170 for each photonic element 116, or group of photonic elements 116, on semiconductor substrate 152. Thus, guard ring 140 may provide a continuous structure for protecting active circuitry 106 (FIG. 3 only) and accommodating photonic elements 116, without being separated into multiple non-continuous guard structures as noted elsewhere herein.

Figure 10:
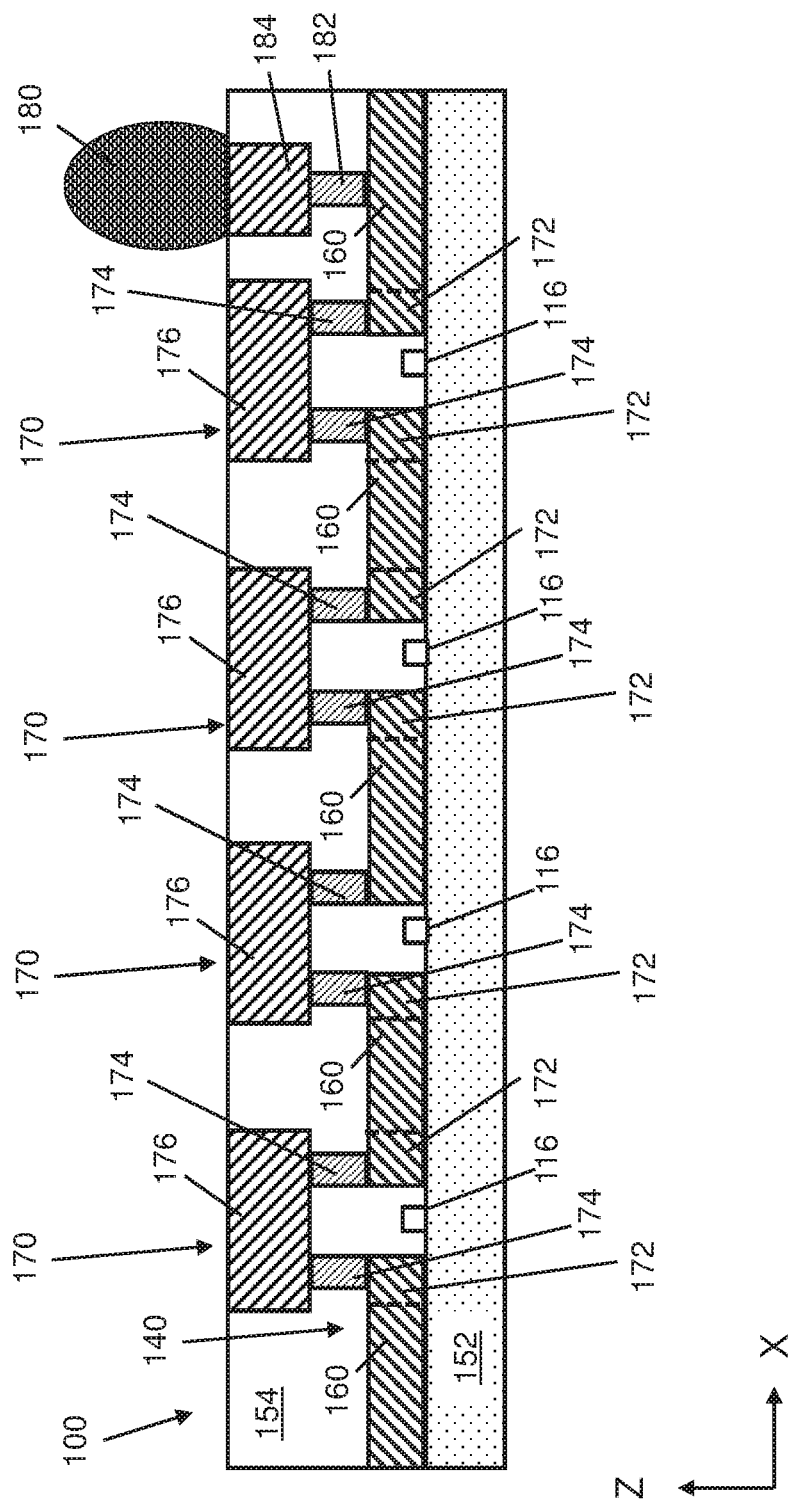
FIG. 10 shows a cross-sectional view the guard ring coupled to a solder bump according to embodiments of the disclosure.

Referring to FIGS. 3 and 10 together, the structural continuity of guard ring 140 may provide advantages beyond mechanical stability. In addition to physically protecting active circuitry 106 (FIG. 3) of PIC die 100, guard ring 140 may also dissipate electrical energy within PIC die 100 to ground as discussed elsewhere herein. In addition or alternatively to using semiconductor substrate 152 as an electrical ground of guard ring 140, it is possible to dissipate electrical energy through other components. In the case of guard ring 140, a single electrical ground may connect to all conductive bodies 160 and conductive bridge elements 170 of guard ring 140. According to an embodiment, PIC die 100 may include a solder bump 180 for coupling PIC die 100 at an outermost layer of ILD 154 to an overlying portion of chip packaging (not shown). To electrically ground guard ring 140, a grounding via 182 may be formed within ILD 154 and coupled to conductive body 160. Grounding via 182 thus may electrically couple solder bump 180 to guard ring 140. Grounding via 182 may include one or more of the example materials included within via(s) 174, or may include any other currently known or later developed conductive metal. Where applicable, a grounding wire 184 (e.g., a metal level layer, bond pad, etc.) may be positioned vertically beneath solder bump 180 to electrically couple grounding via 182 to solder bump 180. Guard ring 140 being continuous about active circuitry 106 may allow solder bump 180 to be the sole electrical ground for all of guard ring 140, e.g., in cases where conductive body 160 does not physically contact semiconductor substrate 152. Where applicable, guard ring 140 may include only one solder bump 180, without other electrical grounding components (e.g., solder bumps, ground connections, etc.) being in contact with conductive body 160 and/or conductive bridge element(s) 170.

Referring solely to FIG. 3, guard ring 140 of PIC die 100 may include additional structural features and advantages as compared to PIC dies with conventional guard structures. Guard ring 140, as shown, may be positioned within PIC die 100 horizontally between active circuitry 106 and a crack stop region 190 positioned near exterior sidewall E. Crack stop region 190 may include one or more currently known or later developed crack stop structures configured to prevent inward crack propagation when PIC die 100 is separated from a larger structure. Crack stop region 190 thus may be located within a kerf region 192 of PIC die 100. Kerf region 192 generally refers to a portion of PIC die 100 without active circuitry, marking the location where PIC die 100 is separated from a larger semiconductor wafer including multiple PIC dies 100. Guard ring 140, including conductive body 160 and conductive bridge element(s) 170, therefore may be horizontally between active circuitry 106 and kerf region 192. As shown photonic element 116 may extend horizontally through crack stop 190, e.g., through openings or gaps formed therein to accommodate photonic element(s) 116. Guard ring 140 thus provides a continuous structure which protects active circuitry 106 and horizontally-extending photonic elements 116, and in some cases may include a single electrical connection to ground through solder bump 180. Guard ring 140 as discussed herein may occupy less space than conventional structures by extending continuously about active circuitry 106, while minimizing or altogether preventing transmission loss (i.e., reflections) due to horizontal separation between photonic element(s) 116 and conductive body 106.

The method as described above is used in the fabrication of integrated circuit chips. The resulting integrated circuit chips may be distributed by the fabricator in raw wafer form (that is, as a single wafer that has multiple unstructured chips), as a bare die, or in a structured form. In the latter case the chip is mounted in a single chip structure (such as a plastic carrier, with leads that are affixed to a motherboard or other higher level carrier) or in a multichip structure (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A photonic integrated circuit (PIC) die, comprising:
a semiconductor substrate;
active circuitry on the semiconductor substrate;
an inter-level dielectric (ILD) over the semiconductor substrate and the active circuitry;
a photonic element extending from the active circuitry on the semiconductor substrate;
a guard ring on the semiconductor substrate and within the ILD, the guard ring surrounding the active circuitry, the guard ring including:
a conductive body, and
a conductive bridge element extending over the photonic element, wherein the conductive bridge element includes a first via coupled to a first terminal segment of the conductive body, a second via coupled to a second terminal segment of the conductive body, and a bridge wire coupling the first and second vias, the bridge wire extending over the photonic element;
a grounding via within the ILD coupled to the conductive body; and
a solder bump on the grounding via, wherein the grounding via electrically couples the guard ring to the solder bump, and wherein the first or second terminal segment of the conductive body is coupled to the grounding via through the bridge wire.

2. The PIC die of claim 1, wherein the guard ring includes a light-reflecting metal.

3. The PIC die of claim 1, wherein a horizontal separation distance between one of the first and second terminal segments and the photonic element is at least two micrometers (μm).

4. The PIC die of claim 1, wherein the first and second vias extend vertically through a plurality of intermediate metal levels within the ILD.

5. The PIC die of claim 1, wherein a horizontal length of the bridge wire between the first and second terminal end segments is at least nine micrometers (μm).

6. The PIC die of claim 1, wherein the guard ring is electrically grounded through a grounding pathway made through the semiconductor substrate.

7. The PIC die of claim 1, wherein the conductive bridge element is horizontally situated between the active circuitry and a kerf region of the PIC die.

8. The PIC die of claim 7, further comprising a crack stop structure horizontally between the kerf region of the PIC die and the conductive bridge element.

9. A photonic integrated circuit (PIC) die, comprising:
a semiconductor substrate;
active circuitry on the semiconductor substrate;
an inter-level dielectric (ILD) over the semiconductor substrate and the active circuitry;

a photonic element extending from the active circuitry on the semiconductor substrate;

a guard ring on the semiconductor substrate and within the ILD, the guard ring surrounding the active circuitry, the guard ring including:

a plurality of conductive bodies on the semiconductor substrate, each having a first terminal segment and an opposing second terminal segment, a first via coupled to the first terminal segment of a first one of the plurality of conductive bodies;

a second via coupled to the second terminal segment of a second one of the plurality of conductive bodies, and a bridge wire coupling the first and second vias, the bridge wire extending above and across the photonic element;

a grounding via within the ILD coupled to the first one of the plurality of conductive bodies; and a solder bump on the grounding via, wherein the grounding via electrically couples the guard ring to the solder bump, and wherein the second one of the plurality of conductive bodies is coupled to the grounding via and the first one of the plurality of conductive bodies through the bridge wire.

10. The PIC die of claim 9, wherein the first and second vias extend vertically through a plurality of intermediate metal levels within the ILD.

11. The PIC die of claim 9, wherein the guard ring is electrically grounded through a grounding pathway made through the semiconductor substrate.

12. The PIC die of claim 9, further comprising a crack stop structure horizontally between a kerf region of the PIC die and the guard ring.

13. A photonic integrated die (PIC) structure, comprising:
a semiconductor substrate;
active circuitry on the semiconductor substrate;
an inter-level dielectric (ILD) over the semiconductor substrate and the active circuitry;
a plurality of photonic elements on the semiconductor substrate extending from the active circuitry to an exterior sidewall of the PIC die;
a guard ring on the semiconductor substrate and within the ILD, the guard ring surrounding the active circuitry, the guard ring including:

a plurality of conductive bodies on the semiconductor substrate, each having a first terminal segment and an opposing second terminal segment, and a plurality of conductive bridge elements, each conductive bridge element including:
a first via coupled to the first terminal segment of one of the plurality of conductive bodies;
a second via coupled to the second terminal segment of one of the plurality of conductive bodies, and
a bridge wire coupling the first and second vias, the bridge wire extending over the photonic element;

a grounding via within the ILD coupled to a selected one of the plurality of conductive bodies; and a solder bump on the grounding via, wherein the grounding via electrically couples the guard ring to the solder bump, and wherein at least one of the plurality of conductive bodies is coupled to the grounding via and the selected one of the plurality of conductive bodies through the bridge wire of one of the plurality of conductive bridge elements.

14. The PIC die of claim 13, wherein the guard ring includes a light-reflecting metal.

15. The PIC die of claim 13, wherein the guard ring is electrically grounded through a grounding pathway made through the semiconductor substrate.

16. The PIC die of claim 13, further comprising a crack stop structure horizontally between a kerf region of the PIC die and the guard ring.

* * * * *